US009471430B2

(12) United States Patent
Park

(10) Patent No.: US 9,471,430 B2
(45) Date of Patent: Oct. 18, 2016

(54) SEMICONDUCTOR DEVICE AND SEMICONDUCTOR SYSTEM INCLUDING THE SAME

(71) Applicant: SK hynix Inc., Gyeonggi-do (KR)

(72) Inventor: Jung-Hoon Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 236 days.

(21) Appl. No.: 14/286,808

(22) Filed: May 23, 2014

(65) Prior Publication Data
US 2014/0258767 A1 Sep. 11, 2014

Related U.S. Application Data

(62) Division of application No. 12/977,542, filed on Dec. 23, 2010, now Pat. No. 8,738,955.

(30) Foreign Application Priority Data

Dec. 29, 2009 (KR) ........................ 10-2009-0133039

(51) Int. Cl.
*G06F 11/14* (2006.01)
*G11C 29/02* (2006.01)
(52) U.S. Cl.
CPC ............... *G06F 11/14* (2013.01); *G11C 29/02* (2013.01); *G11C 29/023* (2013.01); *G11C 29/028* (2013.01)
(58) Field of Classification Search
CPC ..... G06F 11/14; G11C 29/02; G11C 29/023; G11C 29/028
See application file for complete search history.

(56) References Cited

U.S. PATENT DOCUMENTS

| 7,003,686 B2 | 2/2006 | Chua-Eoan et al. |
| 8,170,169 B2* | 5/2012 | Martin ...................... H03L 7/07 375/371 |
| 2002/0157031 A1 | 10/2002 | Lin |
| 2008/0130816 A1* | 6/2008 | Martin ...................... H03L 7/07 375/373 |
| 2008/0144423 A1 | 6/2008 | Kwak |
| 2009/0079485 A1 | 3/2009 | Lin |

FOREIGN PATENT DOCUMENTS

| CN | 1475922 | 2/2004 |
| CN | 1574086 | 2/2005 |

OTHER PUBLICATIONS

Notification of the First Office Action issued by the State Intellectual Property Office of People's Republic of China on Jul. 30, 2014.

* cited by examiner

*Primary Examiner* — M Elamin
(74) *Attorney, Agent, or Firm* — IP & T Group LLP

(57) ABSTRACT

A semiconductor device includes an internal circuit configured to perform a specified operation in response to a predetermined command; a normal data input/output section configured to input/output a normal data synchronized with a center of a source clock, in response to data input/output commands; and a data recovery information signal input/output block configured to receive and store a data recovery information signal synchronized with an edge of the source clock and having a predetermined pattern, in response to either a command of the data input/output commands or the predetermined command upon entry to a data recovery operating mode, and to output the data recovery information signal after the passage of a predetermined time period.

15 Claims, 4 Drawing Sheets

SEMICONDUCTOR DEVICE AND SEMICONDUCTOR SYSTEM INCLUDING THE SAME

CROSS-REFERENCE TO RELATED APPLICATIONS

This application is a division of U.S. patent application Ser. No. 12/977,542 filed on Dec. 23, 2010, now U.S. Pat. No. 8,738,955, which claims priority of Korean Patent Application No. 10-2009-0133039, filed on Dec. 29, 2009. The disclosure of each of the foregoing application is incorporated herein by reference in its entirety.

BACKGROUND OF THE INVENTION

Exemplary embodiments of the present invention relate to semiconductor design technology, and more particularly, to a semiconductor device and method for correcting a write clock and write data.

In a system composed of a plurality of semiconductor elements, a semiconductor device functions to store data. If a data processing device, for example, a memory control unit (MCU) requests data, the semiconductor device outputs the data corresponding to the address inputted from the device which requests the data, or stores the data provided from the device which requests the data, to a position corresponding to the address.

While data is being inputted/outputted between the data processing device and the semiconductor device, if the operating temperature or the operating power of a semiconductor system changes, the phase of the data inputted/outputted between the data processing device and the semiconductor device may vary.

In more detail, it is the norm that the data inputted/outputted between the data processing device and the semiconductor device is inputted/outputted by being synchronized with a clock for transmitting data. In this regard, while the data is being inputted/outputted between the data processing device and the semiconductor device, if the operating temperature or the operating power of a semiconductor system changes, the phase of the data inputted/outputted between the data processing device and the semiconductor device and the phase of the clock for transmitting data are likely to be mismatched so that data having a phase different from that of the initially transmitted data may be inputted/outputted. Due to this fact, a problem can be caused in that the data inputted/outputted between the data processing device and the semiconductor device is likely to be recognized in such a state that it leads or lags by one cycle in comparison with a desired state. That is to say, normal data transmission may be impossible.

For example, describing a procedure of transmitting data from the data processing device to the semiconductor device, the data is transmitted toward the semiconductor device by being synchronized with the center of the clock for transmitting data in the data processing device. In this regard, while transmitting the data, if the operating temperature or the operating power of a semiconductor system changes, the phase of the data may vary so as to be mismatched with the phase of the clock for transmitting data. Due to this fact, the data transmitted from the semiconductor device may not be synchronized with the center of the clock for transmitting data and may fluctuate to some extent so as to either lead or lag. Consequently, a problem can be caused in that the data inputted/outputted between the data processing device and the semiconductor device is likely to be recognized in such a state that it leads or lags by one cycle in comparison with a desired state.

The problem may become more serious as the transmission frequency of the data inputted/outputted between the data processing device and the semiconductor device increases. That is to say, as the transmission frequency of the data inputted/outputted between the data processing device and the semiconductor device increases, the window length of the data to be transmitted becomes very short. Therefore, if a phenomenon, in which the operating temperature or the operating power of a semiconductor system changes, the data inputted/outputted between the data processing device and the semiconductor device is likely to be recognized in such a state that it leads or lags by one cycle in comparison with a desired state.

SUMMARY OF THE INVENTION

An embodiment of the present invention is directed to a semiconductor device and an operating method thereof, which can allow data to be always stably inputted/outputted between a semiconductor device controller and the semiconductor device, irrespective of a variation in the phase of the data due to the operating temperature or the operating power of a semiconductor system changing when data is inputted/outputted between the semiconductor device controller and the semiconductor device.

In accordance with an embodiment of the present invention, a semiconductor device includes: an internal circuit configured to perform a specified operation in response to a predetermined command; a normal data input/output section configured to input/output normal data synchronized with a center of a source dock, in response to data input/output commands; and a data recovery information signal input/output block configured to receive and store a data recovery information signal synchronized with an edge of the source clock and having a predetermined pattern, in response to either a command of the data input/output commands or the predetermined command upon entry to a data recovery operating mode, and to output the data recovery information signal after passage of a predetermined period of time.

In accordance with another embodiment of the present invention, a semiconductor device includes: an internal circuit configured to perform a specified operation in response to a predetermined command; a normal data input/output section configured to input/output normal data synchronized with a center of a data clock, from input time of data input/output commands to data input/output time in synchronism with a system clock; and a data recovery information signal input/output block configured to receive and store a data recovery information signal synchronized with an edge of the data clock and having a predetermined pattern, at a recovery information input time at the same time as the data input time in response to either a command of the data input/output commands or the predetermined command upon entry to a data recovery operating mode, and to output the stored data recovery information signal at recovery information output time after the passage of a predetermined time period determined in response to the data clock.

In accordance with another embodiment of the present invention, a method for operating a semiconductor device includes: receiving normal data synchronized with a center of a source clock, in response to a data input command; and receiving and storing a data recovery information signal synchronized with an edge of the source clock and having a predetermined pattern, in response to either a command of the data input command, a data output command or a predetermined command, and outputting the data recovery information signal after the passage of a predetermined time period.

In accordance with another embodiment of the present invention, a method for operating a semiconductor device includes: receiving normal data synchronized with a center of a data clock, from an input time of a data input command to a data input time in synchronism with a system clock; and receiving and storing a data recovery information signal synchronized with an edge of the data clock and having a predetermined pattern, at recovery information input time at the same time as the data input time in response to either a command of the data input command, a data output command or a predetermined command, and outputting stored data recovery information signal at a recovery information output time corresponding to after the passage of a predetermined time period determined in response to the data clock.

In accordance with another embodiment of the present invention, a method for operating a semiconductor system including a semiconductor device and a semiconductor device controller includes: transferring a data input command from the semiconductor device controller to the semiconductor device, and transferring normal data synchronized with a center of a source clock after the passage of a first predetermined time period and changed in its phase in correspondence with a feedback data recovery information signal; transferring either a command of the data input command, a data output command or a predetermined command from the semiconductor device controller to the semiconductor device, transferring a data recovery information signal synchronized with an edge of the source clock and having a predetermined pattern, after the passage of the first predetermined time period, and storing the data recovery information signal in the semiconductor device; and transferring stored data recovery information signal as the feedback data recovery information signal from the semiconductor device to the semiconductor device controller, after the passage of a second predetermined time period after the data recovery information signal has been stored in the semiconductor device.

In accordance with another embodiment of the present invention, a method for operating a semiconductor system including a semiconductor device and a semiconductor device controller includes: transferring a data input command from the semiconductor device controller to the semiconductor device, and transferring normal data synchronized with a center of a data clock after the passage of a first predetermined time period in synchronism with a system clock and changed in phase in correspondence with a feedback data recovery information signal; transferring either a command of the data input command, a data output command or a predetermined command from the semiconductor device controller to the semiconductor device, transferring a data recovery information signal synchronized with an edge of the data clock and having a predetermined pattern, after the passage of the first predetermined time period, and storing the data recovery information signal in the semiconductor device; and transferring stored data recovery information signal as the feedback data recovery information signal from the semiconductor device to the semiconductor device controller, after the passage of a second predetermined time period in synchronism with the data clock, after the data recovery information signal has been stored in the semiconductor device.

DESCRIPTION OF THE INVENTION

Figure 1:
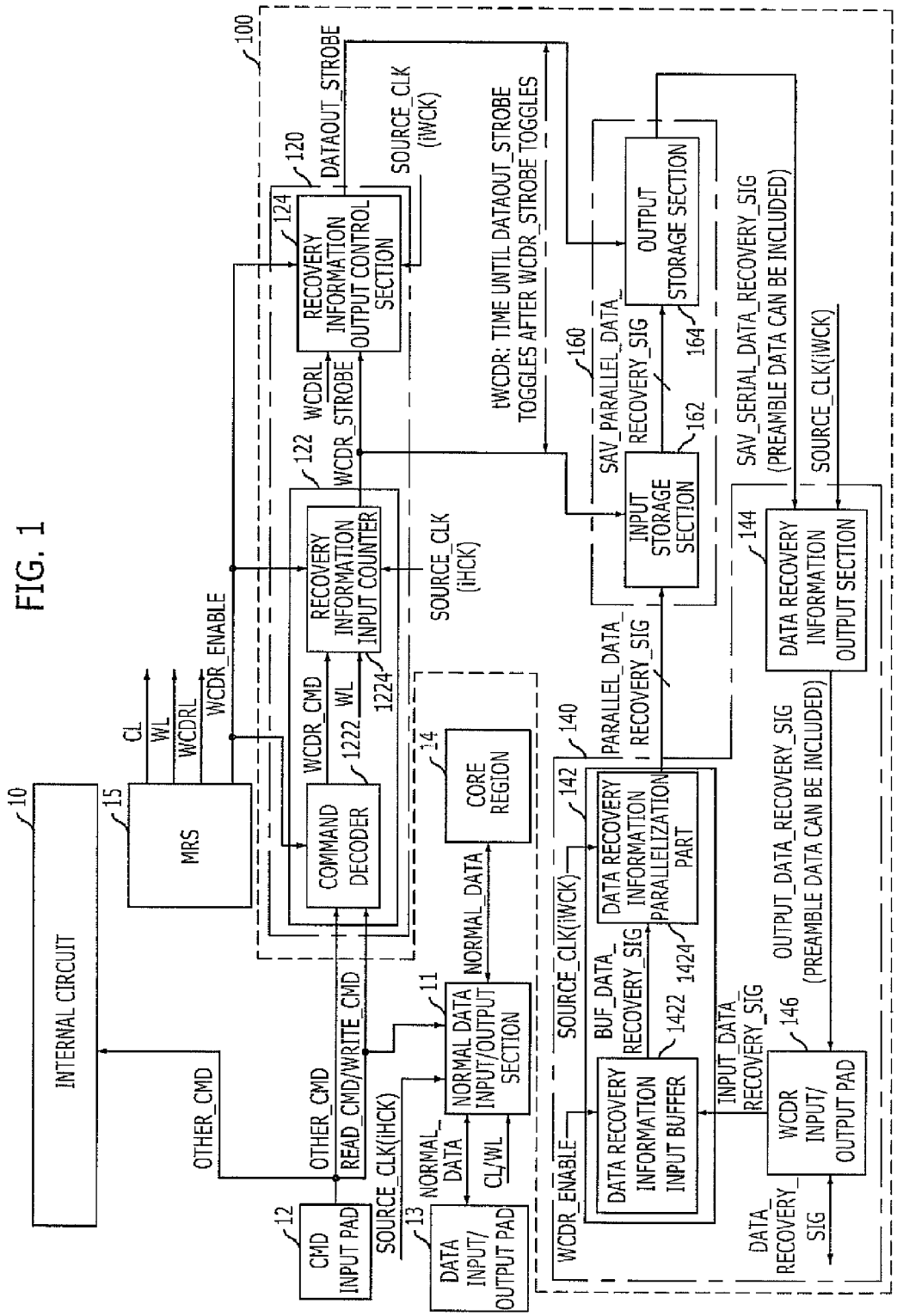
FIG. 1 is a block diagram illustrating in detail a semiconductor device in accordance with an embodiment of the present invention.

Exemplary embodiments of the present invention are described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various drawing figures and embodiments of the present invention.

FIG. 1 is a block diagram illustrating in detail a semiconductor device in accordance with an embodiment of the present invention.

Referring to FIG. 1, a semiconductor device in accordance with an embodiment of the present invention includes an internal circuit 10 configured to perform a predetermined operation in response to a predetermined command OTHER_CMD, a normal data input/output section 11 configured to input/output normal data NORMAL_DATA that is synchronized with the center of a source clock SOURCE_CLK, in response to data input/output commands READ_CMD/WRITE_CMD, and a data recovery information signal input/output block 100 configured to receive a data recovery information signal DATA_RECOVERY_SIG that is synchronized with the edge of the source clock SOURCE_CLK in response to the predetermined command OTHER_CMD upon entry into a data recovery operating mode, and to then output the data recovery information signal DATA_RECOVERY_SIG after the passage of a predetermined time period tWCDRL.

For reference, the data recovery information signal input/output block 100 receives and outputs the data recovery information signal DATA_RECOVERY_SIG during entry into the data recovery operating mode of the semiconductor memory device. The entry into the data recovery operating mode indicates that a data recovery operating enable signal WCDR_ENABLE has been activated. While not directly shown in the drawings, in the following descriptions, a data recovery operating mode will be referred to as WCDR_MODE, and the entry into the data recovery operating mode will be referred to as WCDR_MODE_ENTRY. The activation time, the inactivation time, and the length of an activation interval of the data recovery operating enable signal WCDR_ENABLE are set in advance in a memory register set (MRS) 15. While the predetermined command OTHER_CMD may include various operating mode commands of a semiconductor device as well as the data input/output commands READ_CMD/WRITE_CMD, in a particular example, the predetermined command OTHER_CMD may include an auto refresh operating mode entry command, which is one of operating modes that uses the most power in a semiconductor device, or a standby operating mode entry command, which is one of the operating modes that use the least power in a semiconductor device.

Describing in further detail the configuration of the data recovery information signal input/output block 100, which is among the component elements of the semiconductor device in accordance with this embodiment of the present invention, the data recovery information signal input/output block 100 includes a recovery information input/output control unit 120 configured to generate an internal input strobe signal WCDR_STROBE in correspondence with an internal input point in time of the data recovery information signal DATA_RECOVERY_SIG and an internal output strobe signal DATAOUT_STROBE in correspondence with an output time of the data recovery information signal DATA_RECOVERY_SIG in response to the predetermined command OTHER_CMD and the source clock SOURCE_CLK, a data recovery information input/output unit 140 configured to input/output the data recovery information signal DATA_RECOVERY_SIG through a predetermined pad and a data recovery information storage unit 160 configured to store the data recovery information signal DATA_RECOVERY_SIG for the predetermined time period in response to the internal input strobe signal WCDR_STROBE and the internal output strobe signal DATAOUT_STROBE.

For reference, both the data input/output pad 13 and the WCDR input/output pad 146 may be used as the preselected pad 13 or 146 in that a pad for inputting/outputting the normal data NORMAL_DATA and a pad for inputting/outputting the data recovery information signal DATA_RECOVERY_SIG may be shared, depending upon a design of the semiconductor device.

First, in a conventional semiconductor device, pads are divided into a command input pad 12 configured to receive the data input/output commands READ_CMD/WRITE_CMD and the predetermined command OTHER_CMD, the data input/output pad 13 configured to input/output the normal data NORMAL_DATA, and a data recovery information input/output pad 146 configured to input/output the data recovery information signal DATA_RECOVERY_SIG, such that only the normal data NORMAL_DATA may be inputted/outputted through the data input/output pad 13, and only the data recovery information signal DATA_RECOVERY_SIG may be inputted/outputted through the data recovery information input/output pad 146.

In a semiconductor device in which the number of pads is insufficient and is therefore not possible to have pads dedicated for the input/output of the data recovery information signal DATA_RECOVERY_SIG, pads are divided into the command input pad configured to receive the data input/output commands READ_CMD/WRITE_CMD and the predetermined command OTHER_CMD, and the data input/output pad 13 configured to input/output the normal data NORMAL_DATA and the data recovery information signal DATA_RECOVERY_SIG, such that the normal data NORMAL_DATA may be inputted/outputted through the data input/output pad 13 in a data input/output operating mode READ/WRITE_MODE, and the data recovery information signal DATA_RECOVERY_SIG may be inputted/outputted through the data input/output pad 13 in a data recovery operating mode WCDR_MODE in which the normal data NORMAL_DATA is not directly inputted/outputted.

Among the component elements of the data recovery information signal input/output block 100 in accordance with this embodiment of the present invention, the recovery information input/output control unit 120 includes a recovery information input control section 122 configured to count a number of toggling times of the source clock SOURCE_CLK in response to the predetermined command OTHER_CMD to toggle the recovery information input strobe signal input time during the activation interval of the data recovery operating enable signal WCDR_ENABLE and a recovery information output control section 124 configured to count a number of toggling times of the source clock SOURCE_CLK in response to the toggling the internal input strobe signal WCDR_STROBE to toggle the of the internal output strobe signal DATAOUT_STROBE during the activation interval of the data recovery operating enable signal WCDR_ENABLE.

The recovery information input control section 122 includes a command decoder 1222 configured to generate a data recovery operating command WCDR_CMD in response to the predetermined command OTHER_CMD during the activation interval of the data recovery operating enable signal WCDR_ENABLE, and a recovery information input counter 1224 configured to count the source clock SOURCE_CLK for a time corresponding to a write latency signal WL in response to the data recovery operating command WCDR_CMD during the activation interval of the data recovery operating enable signal WCDR_ENABLE and to determine the toggling time of an internal input strobe signal WCDR_STROBE corresponding to the internal input point in time of the data recovery information signal DATA_RECOVERY_SIG.

The recovery information output control section 124 counts the source clock SOURCE_CLK for a time period corresponding to a data recovery information latency signal WCDRL WCDR latency in response to the toggling of the internal input strobe signal WCDR_STROBE during the activation time interval of the data recovery operating enable signal WCDR_ENABLE and determines the toggling time of the internal output strobe signal DATAOUT_STROBE corresponding to the internal output point in time of the data recovery information signal DATA_RECOVERY_SIG.

At this time, the toggling time of the internal input strobe signal WCDR_STROBE, determined by the recovery information input counter 1224 of the recovery information input control unit 122, is controlled to correspond not to the input start time of the inputted data recovery information signal DATA_RECOVERY_SIG to the semiconductor device but to the input end time of the inputted data recovery information signal DATA_RECOVERY_SIG to the semiconductor device.

That is, the internal input point in of the time data recovery information signal DATA_RECOVERY_SIG is not the input start time of the data recovery information signal DATA_RECOVERY_SIG to the semiconductor device but the input end time of the data recovery information signal DATA_RECOVERY_SIG to the semiconductor device.

When the data recovery information signal DATA_RECOVERY_SIG is a multiple-bit signal, the data recovery information signal DATA_RECOVERY_SIG should be stared in the data recovery information storage unit 160 after all of the bits thereof have been inputted.

For example, if the data recovery information signal DATA_RECOVERY_SIG is a signal composed of a relatively large number of bits, then a time difference between the input time of a first bit of the data recovery information signal DATA_RECOVERY_SIG and the input time of the last bit of data recovery information signal DATA_RECOVERY_SIG becomes relatively large, and if the data recovery information signal DATA_RECOVERY_SIG is a signal composed of a relatively small number of bits, then a time difference between the input time of the first bit of the data recovery information signal DATA_RECOVERY_SIG and the input time of the last bit of the data recovery information signal DATA_RECOVERY_SIG becomes relatively small.

For reference, because the burst length (BL) of a data signal is the number of bits of continuously inputted data signals, the time difference between the input start time and the internal input point in time of the data recovery information signal DATA_RECOVERY_SIG varies according to the burst length (BL) of the data recovery information signal DATA_RECOVERY_SIG.

Furthermore, in this embodiment of the present invention, the burst length (BL) of the data recovery information signal DATA_RECOVERY_SIG and the burst length (BL) of the normal data NORMAL_DATA are set to be the same. Therefore, since the burst length (BL) of the normal data NORMAL_DATA is synchronized with the period tck of the source clock SOURCE_CLK, the burst length (BL) of the data recovery information signal DATA_RECOVERY_SIG is also synchronized with the period tck of the source clock SOURCE_CLK.

Further, in this embodiment of the present invention, the normal data NORMAL_DATA and the data recovery information signal DATA_RECOVERY_SIG are set to be supplied at the same time. That is to say, the time from the time at which the data input command WRITE_CMD is inputted to the time at which the normal data NORMAL_DATA is inputted and the time from the time at which the predetermined command OTHER_CMD is inputted to the time at which the data recovery information signal DATA_RECOVERY_SIG is inputted are set to be the same.

At this time, since the predetermined command OTHER_CMD includes the data input command WRITE_CMD, the data recovery information signal DATA_RECOVERY_SIG is set to be supplied at the same time when the normal data NORMAL_DATA is not inputted.

That is to say, the time from the time at which the data input command WRITE_CMD is inputted to the time at which the data recovery information signal DATA_RECOVERY_SIG is inputted and the time from the time at which a rest of command except for the data input command WRITE_CMD among the predetermined command OTHER_CMD is inputted to the time at which the data recovery information signal DATA_RECOVERY_SIG is inputted are set to be the same.

For reference, the value of a write latency signal WL is stored in the memory register set (MRS) 15 of the semiconductor device. The value of the write latency signal WL is equal to the time interval that the data input command WRITE_CMD and the normal data NORMAL_DATA are to be inputted, and serves as a specification that is essentially included in a semiconductor device.

Accordingly, in this embodiment of the present invention, it is to be understood that the time at which the data recovery information signal DATA_RECOVERY_SIG is supplied to the semiconductor device is determined in correspondence with the value of the write latency signal WL stored in the memory register set (MRS) 15.

Thus, it is necessary to supply the write latency signal WL to the recovery information input counter 1224 which generates the internal input strobe signal WCDR_STROBE for defining the time at which the data recovery information signal DATA_RECOVERY_SIG is actually stored, so as to specify at which time the data recovery information signal DATA_RECOVERY_SIG is inputted to the semiconductor device, such that it is possible to toggle the internal input strobe signal WCDR_STROBE at the time at which all of the bits of the data recovery information signal DATA_RECOVERY_SIG are inputted.

The recovery information input counter 1224 performs the counting operation for the period tck of the source clock SOURCE_CLK in correspondence with the write latency signal WL, and the burst length (BL) of the data recovery information signal DATA_RECOVERY_SIG as an additional time is determined in correspondence with the period tck of the source clock SOURCE_CLK. Thus, the toggling time of the internal input strobe signal WCDR_STROBE outputted by the recovery information input counter 1224 is synchronized with the source clock SOURCE_CLK as well.

Also, the recovery information output control unit 124 performs the counting operation for the period tck of the source clock SOURCE_CLK in correspondence with the data recovery information latency signal WCDRL after the internal input strobe signal WCDR_STROBE toggles, such that the toggling time of the internal output strobe signal DATAOUT_STROBE is determined. Thus, the toggling time of the internal output strobe signal DATAOUT_STROBE outputted by the recovery information output control unit 124 is synchronized with the source clock SOURCE_CLK as well.

Similar to the value of the write latency signal WL, the value of the data recovery information latency signal WCDRL is set in advance in the memory register set (MRS) 15. However, unlike the write latency signal WL, the data recovery information latency signal WCDRL is newly defined for this embodiment of the present invention.

Accordingly, the value of the data recovery information latency signal WCDRL may be changed by a designer, and a time period tWCDR that has elapsed after the data recovery information signal DATA_RECOVERY_SIG has been inputted and stored until the data recovery information signal DATA_RECOVERY_SIG has been outputted again is a parameter that is totally determined by the desire of the designer.

Among the component elements of the data recovery information input/output block 100 in accordance with this embodiment of the present invention, the data recovery information input/output unit 140 includes a data recovery information input section 142 configured to buffer the data recovery information signal DATA_RECOVERY_SIG serially supplied through the preselected pad 13 or 146 during the activation interval of the data recovery operating enable signal WCDR_ENABLE as a buffered data recovery information signal BUF_DATA_RECOVERY_SIG and to parallelize a buffered data recovery information signal BUF_DATA_RECOVERY_SIG in synchronism with the source clock SOURCE_CLK as a parallelized data recovery information signal PARALLEL_DATA_RECOVERY_SIG, and a data recovery information output section 144 configured to output a saved data recovery information signal OUTPUT_PARALLEL_DATA_RECOVERY_SIG provided from the data recovery information storage unit 160 through the preselected pad 13 or 146 in synchronism with the source clock SOURCE_CLK.

The data recovery information input section 142 includes a data recovery information input buffer 1422 configured to buffer the data recovery information signal DATA_RECOVERY_SIG serially supplied through the preselected pad 13 or 146 during the activation time interval of the data recovery operating enable signal WCDR_ENABLE as the buffered data recovery information signal BUF_DATA_RECOVERY_SIG, and a data recovery information parallelizing part 1424 configured to parallelize the output signal of the data recovery information input buffer 1422 in synchronism with the source clock SOURCE_CLK as the parallelized data recovery information signal PARALLEL_DATA_RECOVERY_SIG.

While the data recovery information signal DATA_RECOVERY_SIG is expressed as being serially supplied to the data recovery information input buffer 1422, this is because the number of bits of the data recovery information signal DATA_RECOVERY_SIG is determined in correspondence with the burst length of the normal data NORMAL_DATA. In other words, in a general semiconductor device, since a scheme in which a specified burst length is determined when receiving the normal data NORMAL_DATA and the number of bits of the normal data NORMAL_DATA corresponding to the specified burst length is serially inputted, is mainly adopted, the data recovery information signal DATA_RECOVERY_SIG which must have the same number of bits as that of the normal data NORMAL_DATA to be serially inputted with the number of bits corresponding to the burst length.

Further, since the data recovery information signal DATA_RECOVERY_SIG is serially inputted with the number of bits corresponding to the burst length of the normal data NORMAL_DATA, in order to allow the data recovery information signal DATA_RECOVERY_SIG to be easily stored in the data recovery information storage unit 160, it is necessary to parallelize the buffered data recovery information signal BUF_DATA_RECOVERY_SIG in correspondence with the source clock SOURCE_CLK in the data recovery information parallelizing part 1424 as the parallelized data recovery information signal PARALLEL_DATA_RECOVERY_SIG.

The data recovery information output section 144 synchronizes the data recovery information signal DATA_RECOVERY_SIG stored in the data recovery information storage unit 160 with the source clock SOURCE_CLK and to serially output synchronized data recovery information signal DATA_RECOVERY_SIG through the predetermined pad 13 or 146.

Among the component elements of the data recovery information signal input/output block 100 in accordance with this embodiment of the present invention, the data recovery information storage unit 160 may be divided into two types as described below.

A first type of the data recovery information storage unit 160 includes an input storage section 162 configured to simultaneously store the parallelized data recovery information signal PARALLEL_DATA_RECOVERY_SIG inputted in parallel through the data recovery information input part 142 at the internal input point in time of the data recovery information signal DATA_RECOVERY_SIG that corresponds to the toggling time of the internal input strobe signal WCDR_STROBE, and an output storage section 164 configured to serially provide a saved parallelized data recovery information signal SAV_PARALLEL_DATA_RECOVERY_SIG stored through the input storage section 162 at the internal output point in time of the data recovery information signal DATA_RECOVERY_SIG that corresponds to the toggling time of the internal output strobe signal DATAOUT_STROBE, to the data recovery information output section 144.

A second type of the data recovery information storage unit 160 includes an input storage section 162 configured to simultaneously store the parallelized data recovery information signal PARALLEL_DATA_RECOVERY_SIG inputted in parallel through the data recovery information input part 142 at the internal input point in time of the data recovery information signal DATA_RECOVERY_SIG that corresponds to the toggling time of the internal input strobe signal WCDR_STROBE, and an output storage section 164 configured to serially provide a preset preamble data PREAMBLE DATA to the data recovery information output section 144 at the output time of the data recovery information signal DATA_RECOVERY_SIG that corresponds to the toggling time of the internal output strobe signal DATAOUT_STROBE and then serially provide the saved parallelized recovery information signal SAV_PARALLEL_DATA_RECOVERY_SIG transferred from the input storage section 162 to the data recovery information output section 144 as a signal OUTPUT_PARALLELL_DATA_RECOVERY_SIG.

As described above, the data recovery information storage unit 160 in accordance with this embodiment of the present invention is divided into two types. In the first type, the data recovery information signal DATA_RECOVERY_SIG supplied through the data recovery information input part 142 is stored and outputted as is after the predetermined time period tWCDRL has elapsed, and in the second type, the data recovery information signal DATA_RECOVERY_SIG supplied through the data recovery information input part 142 is stored and outputted along with the preamble data PREAMBLE DATA after the predetermined time period tWCDRL has elapsed.

Namely, the recovery information storage unit 160 in accordance with this embodiment of the present invention may output both the stored data recovery information signal OUTPUT_PARALLELL_DATA_RECOVERY_SIG and the preamble data PREAMBLE DATA, and may solely output the stored data recovery information signal OUTPUT_PARALLELL_DATA_RECOVERY_SIG, as the occasion demands.

The data recovery information signal DATA_RECOVERY_SIG supplied through the preselected pad 13 or 146 is a signal that has a predetermined pattern.

For example, assuming that the data recovery information signal DATA_RECOVERY_SIG is an 8-bit signal. The pattern of the data recovery information signal DATA_RECOVERY_SIG supplied through the preselected pad 13 or 146 may be '01010101', '00110011', '00001111', '10101010', '11001100', '11110000', '10011001' or '01100110'.

Also, in the above descriptions, the data recovery information signal DATA_RECOVERY_SIG supplied through the preselected pad 13 or 146 is synchronized with the edge of the source clock SOURCE_CLK.

Accordingly, in the case where the phase of the data recovery information signal DATA_RECOVERY_SIG changes in the course of being transmitted, the value of the data recovery information signal DATA_RECOVERY_SIG easily varies, whereby it is possible to easily check whether or not the phase has changed.

For example, assuming that the pattern of the data recovery information signal DATA_RECOVERY_SIG is '10011001' when the respective bits of the data recovery information signal DATA_RECOVERY_SIG are precisely synchronized with the edge of the source clock SOURCE_CLK, if the phase of the data recovery information signal DATA_RECOVERY_SIG becomes faster while the data recovery information signal DATA_RECOVERY_SIG is being transmitted to the preselected pad 13 or 146, the pattern of the data recovery information signal DATA_RECOVERY_SIG stored through the preselected pad 13 or 146 becomes '11001100', whereby the phase becomes faster. Conversely, if the phase of the data recovery information signal DATA_RECOVERY_SIG becomes slower while the U) data recovery information signal DATA_RECOVERY_SIG is being transmitted to the preselected pad 13 or 146, the pattern of the data recovery information signal DATA_RECOVERY_SIG stored through the preselected pad 13 or 146 becomes '00110011', whereby the phase becomes slower.

The above-described semiconductor device in accordance with this embodiment of the present invention receives the data input/output commands READ_CMD/WRITE_CMD and the predetermined command OTHER_CMD in correspondence with one source clock SOURCE_CLK, inputs and outputs of the normal data NORMAL_DATA and the data recovery information signal DATA_RECOVERY_SIG.

The above-described method of using only one source clock SOURCE_CLK is mainly adopted in a semiconductor device having a low operating speed. In a semiconductor device having a high operating speed, another method is mainly adopted in which a system clock iHCK for synchronizing command signals including the predetermined command OTHER_CMD and a data clock iWCK, having a frequency two times higher than the system dock iHCK, for synchronizing the normal data NORMAL_DATA, are simultaneously used. Therefore, this embodiment of the present invention may be applied to a semiconductor device operating at a high speed as described below.

Referring again to FIG. 1, a semiconductor device operating at a high speed in accordance with this embodiment of the present invention includes an internal circuit 10 configured to perform a predetermined operation in response to a predetermined command OTHER_CMD, a normal data input/output section 11 configured to receive and output normal data NORMAL_DATA that is synchronized with the center of a data clock iWCK, at data input/output times respectively set in synchronism with a system clock iHCK from the input time of data input/output commands READ_CMD/WRITE_CMD, and a data recovery information signal input/output block 100 configured to receive a data recovery information signal DATA_RECOVERY_SIG that is synchronized with the edge of the data clock iWCK, at recovery information input time as the same time with the data input time in response to the predetermined command OTHER_CMD, and then output a saved data recovery information signal OUTPUT_PARALLELL_DATA_RECOVERY_SIG at recovery information output time after the passage of a predetermined period of time tWCDRL determined in response to the data clock iWCK.

Here, the data input time during the time at which the normal data NORMAL_DATA is inputted is a time when the system clock iHCK toggles a first predetermined number of times after the input time of the data input command WRITE_CMD, and the data output time during a time at which the normal data NORMAL_DATA is outputted is a time when the system clock iHCK toggles a second predetermined number of times after the input time of the data output command READ_CMD.

At this time, the first predetermined number of times is a value that is preset in a memory register set (MRS) 15 as the value of a write latency signal WL. Similarly, the second predetermined number of times is a value that is preset in the memory register set (MRS) 15 as the value of a column latency signal CL.

Namely, the data input time during the time at which the normal data NORMAL_DATA is inputted is a time when a time corresponding to "the value of the write latency signal WL*the period tck of the system clock iHCK" has elapsed from the input time of the data input command WRITE_CMD, and the data output time during the time at which the normal data NORMAL_DATA is outputted is a time when a time corresponding to "the value of the column latency signal CL*the period tck of the system clock iHCK" has elapsed from the input time of the data output command READ_CMD.

Since the time at which the normal data NORMAL_DATA is inputted and the time at which the data recovery information signal DATA_RECOVERY_SIG is inputted are set to be the same, the time at which the data recovery information signal DATA_RECOVERY_SIG is inputted corresponds to the time when a time corresponding to "the value of the write latency signal WL*the period tck of the system clock iHCK" has elapsed from the input time of the predetermined command OTHER_CMD.

For reference, the data recovery information signal input/output block 100 receives and outputs the data recovery information signal DATA_RECOVERY_SIG, in the case where the semiconductor device enter the data recovery operating mode. the entry to the data recovery operating mode indicates that a data recovery operating enable signal WCDR_ENABLE has been activated. While not directly shown in the drawings, in the following descriptions, a data recovery operating mode will be referred to as WCDR_MODE, and the entry to the data recovery operating mode will be referred to as WCDR_MODE_ENTRY. The activation time, the inactivation time, and the length of an activation interval of the data recovery operating enable signal WCDR_ENABLE are set in advance in a memory register set (MRS) 15.

While the predetermined command OTHER_CMD may include the data input/output commands READ_CMD/WRITE_CMD, various operating mode commands of a semiconductor device, in a particular example, the predetermined command OTHER_CMD may be an auto refresh operating mode entry command, which is one of the operating modes in a semiconductor device that use the most power or a standby operating mode entry command, which is one of the operating modes in a semiconductor device that use the least power.

The data recovery information signal input/output block 100, which is one of the component elements of the semiconductor device in accordance with this embodiment of the present invention, includes a recovery information input/output control unit 120 configured to generate an internal input strobe signal WCDR_STROBE in response to a command of the predetermined command OTHER_CMD or the system clock iHCK during the activation interval of the data recovery operating enable signal WCDR_ENABLE and to generate an internal output strobe signal DATAOUT_STROBE in response to the data clock signal iWCK and the internal input strobe signal WCDR_STROBE, a data recovery information input/output unit 140 configured to input/output the data recovery information signal DATA_RECOV- ERY_SIG through a preselected pad 13 or 146, and a data recovery information storage unit 160 configured to store the data recovery information signal DATA_RECOVERY_SIG for a predetermined time period tWCDRL in response to the internal input strobe signal WCDR_STROBE and the internal output strobe signal DATAOUT_STROBE.

Both the data input/output pad 13 and the WCDR input/output pad 146 may be used as the preselected pad 13 or 146 since a pad for inputting/outputting the normal data NORMAL_DATA and a pad for inputting/outputting the data recovery information signal DATA_RECOVERY_SIG may be shared depending upon a design of a semiconductor device.

In a conventional semiconductor device, pads are divided into a command input pad 12 configured to receive the data input/output commands READ_CMD/WRITE_CMD and the predetermined command OTHER_CMD, the data input/output pad 13 configured to input/output the normal data NORMAL_DATA, and a data recovery information input/output pad 146 configured to input/output the data recovery information signal DATA_RECOVERY_SIG, such that only the normal data NORMAL_DATA may be inputted/outputted through the data input/output pad 13, and only the data recovery information signal DATA_RECOVERY_SIG may be inputted/outputted through the data recovery information input/output pad 146.

In a semiconductor device in which the total number of pads is insufficient, therefore being unable to have pads dedicated for the input/output of the data recovery information signal DATA_RECOVERY_SIG, the pads are divided into the command input pad 12 configured to receive the data input/output commands READ_CMD/WRITE_CMD and the predetermined command OTHER_CMD, and the data input/output pad 13 configured to input/output the normal data NORMAL_DATA and the data recovery information signal DATA_RECOVERY_SIG, such that the normal data NORMAL_DATA may be inputted/outputted through the data input/output pad 13 in a data input/output operating mode READ/WRITE_MODE, and the data recovery information signal DATA_RECOVERY_SIG may be inputted/outputted through the data input/output pad 13 in a data recovery operating mode WCDR_MODE in which the normal data NORMAL_DATA is not directly inputted/outputted.

Among the component elements of the data recovery information signal input/output block 100 in accordance with this embodiment of the present invention, the recovery information input/output control unit 120 includes a recovery information input control section 122 configured to generate the internal input strobe signal WCDR_STROBE in response to a third number of times that the toggling of the system clock iHCK occurs from the time at which the predetermined command OTHER_CMD has been inputted, during the activation interval of the data recovery operating enable signal WCDR_ENABLE, and a recovery information output control section 124 configured to generate the internal output strobe signal DATAOUT_STROBE in response to a fourth number of times that the toggling of the data clock iWCK occurs from the time at which the internal input strobe signal WCDR_STROBE toggles, during the activation interval of the data recovery operating enable signal WCDR_ENABLE.

At this time, the third number of times has a value larger by the burst length (BL) than the first number of times corresponding to the value of the write latency signal WL, and may be set in such a manner that the write latency signal WL is supplied to the recovery information input counter 1224 which is provided in the recovery information input control unit 122. The fourth number of times is the value of the data recovery information latency signal WCDRL that is newly set in the memory register set (MRS) 15 in accordance with this embodiment of the present invention.

That is to say, the time at which the internal input strobe signal WCDR_STROBE is toggled in the recovery information input control unit 122 is the time when a time corresponding to "{the value of the write latency signal WL+the burst length (BL)}*the period tck of the system clock iHCK" has elapsed from the time at which either a command of the data input/output commands READ_CMD and WRITE_CMD or the predetermined command OTHER_CMD has been inputted, and the time at which the internal output strobe signal DATAOUT_STROBE is toggled in the recovery information output control section 124 is the time when a time corresponding to "the value of the data recovery information latency signal WCDRL*the period tck of the data clock iWCK" has elapsed from the time at which the internal input strobe signal WCDR_STROBE has been toggled.

Accordingly, the time at which the internal input strobe signal WCDR_STROBE is toggled in the recovery information input control unit 122 corresponds to the time that is later, by a time corresponding to "the burst length (BL)*the period tck of the system clock iHCK", than the time at which the normal data NORMAL_DATA and the data recovery information signal DATA_RECOVERY_SIG are inputted.

In this regard, the time at which the internal input strobe signal WCDR_STROBE is toggled in the recovery information input control unit 122 is later than the time at which the normal data NORMAL_DATA and the data recovery information signal DATA_RECOVERY_SIG are inputted because when the data recovery information signal DATA_RECOVERY_SIG is a multiple-bit signal, it should be stored in the data recovery information storage unit 160 after all of the bits have been inputted.

Among the component elements of the data recovery information input/output block 100, the data recovery information input/output unit 140 includes a data recovery information input section 142 configured to serially buffer the data recovery information signal DATA_RECOVERY_SIG serially supplied through the preselected pad 13 or 146 from the input time of the recovery information during the activation interval of the data recovery operating enable signal WCDR_ENABLE and parallelize the resultant signal in synchronism with the data clock iWCK, and a data recovery information output section 144 configured to output a data recovery information signal OUTPUT_PARALLEL_DATA_RECOVERY_SIG stored in the data recovery information storage unit 160 through the preselected pad 13 or 146 in synchronism with the data clock iWCK.

Among the component elements of the data recovery information signal input/output block 100 in the semiconductor device in accordance with this embodiment of the present invention that operates at a high speed, the configuration of the data recovery information storage unit 160 is the same as that of the semiconductor device in accordance with the aforementioned embodiment of the present invention, and therefore, a detailed description thereof has been omitted.

Figure 2:
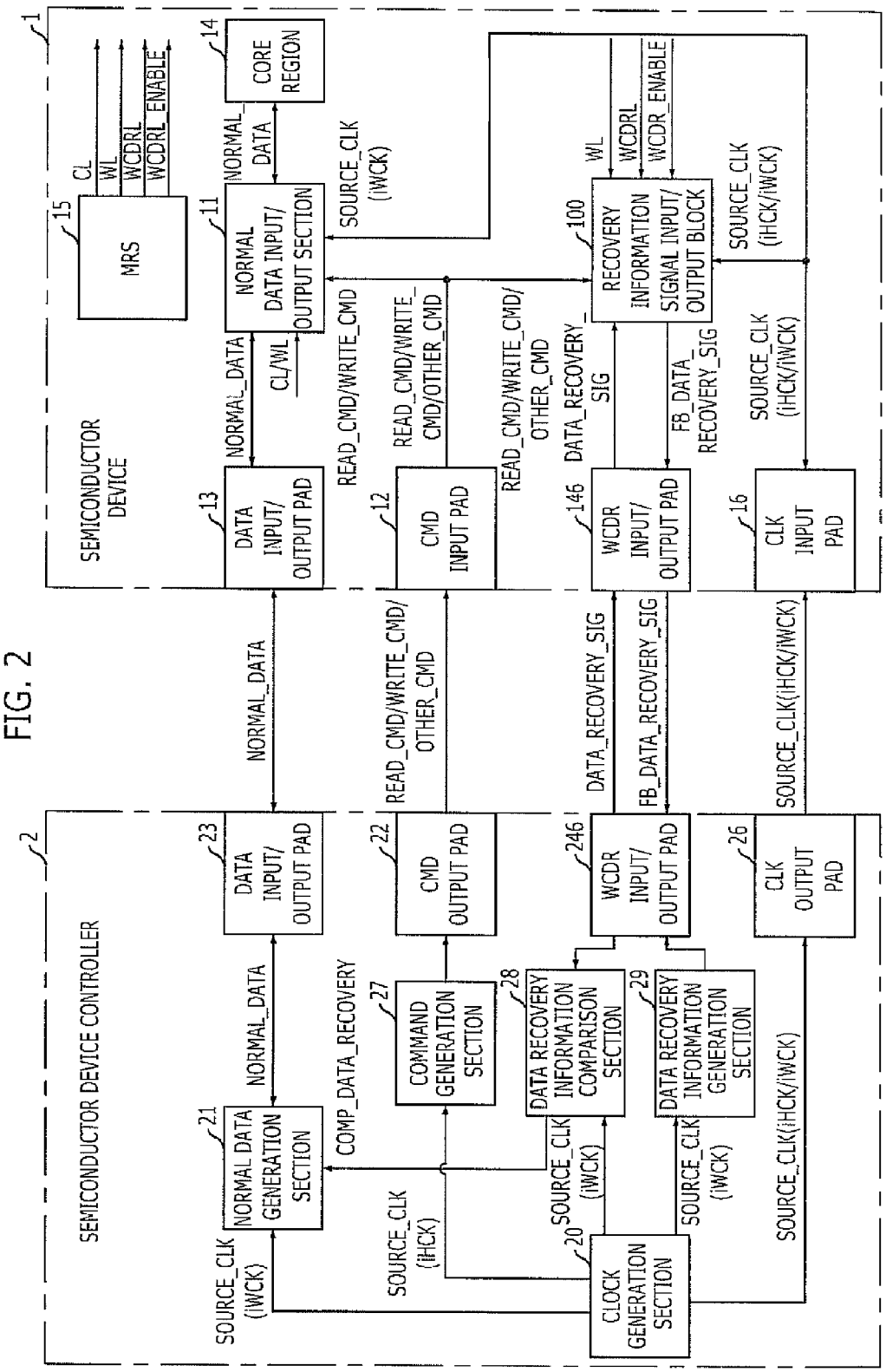
FIG. 2 is a block diagram illustrating a semiconductor system including the semiconductor device shown in FIG. 1, in accordance with another embodiment of the present invention.

FIG. 2 is a block diagram illustrating a semiconductor system including the semiconductor device shown in FIG. 1, in accordance with another embodiment of the present invention.

Referring to FIG. 2, a semiconductor system includes a semiconductor device controller 2 configured to compare a data recovery information signal DATA_RECOVERY_SIG and a feedback data recovery information signal FB_DATA_RECOVERY_SIG and adjust a phase of the normal data NORMAL_DATA transferred to the semiconductor device 1 in correspondence with a comparison result of the data recovery information signal DATA_RECOVERY_SIG and the feedback data recovery information signal FB_DATA_RECOVERY_SIG; and the semiconductor device 1 configured to receive the data recovery information signal DATA_RECOVERY_SIG and transfer the data recovery information signal DATA_RECOVERY_SIG as the feedback data recovery information signal after a passage of a predetermined time period.

At this time, the normal data NORMAL_DATA transferred from the semiconductor controller 2 to the semiconductor device 1 is synchronized with a center of a source clock SOURCE_CLK, and the data recovery information signal DATA_RECOVERY_SIG transferred from the semiconductor controller 2 to the semiconductor device 1 is synchronized with an edge of the source clock SOURCE_CLK.

Furthermore, the normal data NORMAL_DATA is transferred from the semiconductor device controller 2 to semiconductor device 1 at the same time of the data recovery information signal DATA_RECOVERY_SIG is transferred from the semiconductor device controller 2 to semiconductor device 1.

The semiconductor system further includes a clock transmission path configured to transfer the source clock SOURCE_CLK and a normal data transmission path configured to transfer the normal data NORMAL_DATA. The clock transmission path and the normal data transmission path are formed between the semiconductor device 1 and the semiconductor device controller 2.

The data recovery information signal DATA_RECOVERY_SIG and the feedback data recovery information signal FB_DATA_RECOVERY_SIG are transferred through a recovery information signal transmission formed between the semiconductor device 1 and the semiconductor device controller 2. However, data recovery information signal DATA_RECOVERY_SIG and the feedback data recovery information signal FB_DATA_RECOVERY_SIG are transferred through the normal data transmission path in an operating mode in which the normal data is not transferred through the normal data transmission path.

Accordingly, when the data recovery information signal DATA_RECOVERY_SIG and the feedback data recovery information signal FB_DATA_RECOVERY_SIG are transferred through the normal data transmission path in the operating mode in which the normal data NORMAL_DATA is not transferred through the normal data NORMAL_DATA transmission path, the semiconductor device controller 2 includes a data recovery information comparison unit 28 configured to compare data values of the data recovery information signal DATA_RECOVERY_SIG and the feedback data recovery information signal FB_DATA_RECOVERY_SIG and generate a recovery information comparison signal COMP_DATA_RECOVERY according to a comparison result of the data recovery information signal DATA_RECOVERY_SIG and the feedback data recovery information signal FB_DATA_RECOVERY_SIG, a normal data generation unit 21 configured to generate the normal data NORMAL_DATA by changing the phase of the normal data NORMAL_DATA in correspondence with the recovery information comparison signal COMP_DATA_RECOVERY, a normal data input/output pad 23 configured to input/output the normal data NORMAL_DATA, a recovery information signal input/output pad 246 configured to input/output the data recovery information signal DATA_RECOVERY_SIG and the feedback data recovery information signal FB_DATA_RECOVERY_SIG and a clock output pad 26 configured to output the source clock SOURCE_CLK.

Likewise, the semiconductor device 1 includes a normal data input/output section 11 configured to input/output the normal data NORMAL_DATA, a data recovery information signal input/output block 100 configured to receive and store the data recovery information signal DATA_RECOVERY_SIG and output the stored data recovery information signal DATA_RECOVERY_SIG as the feedback data recovery information signal FB_DATA_RECOVERY_SIG after a predetermined time period tWCDRL has elapsed, a normal data input/output pad 13 configured to input/output the normal data NORMAL_DATA, a recovery information signal input/output pad 146 configured to input/output the data recovery information signal DATA_RECOVERY_SIG and the feedback data recovery information signal FB_DATA_RECOVERY_SIG and a clock output pad 16 configured to receive the source clock SOURCE_CLK.

On the other hand, when the data recovery information signal DATA_RECOVERY_SIG and the feedback data recovery information signal FB_DATA_RECOVERY_SIG are transferred through the normal data transmission path in the operating mode in which the normal data NORMAL_DATA is not transferred through the normal data transmission path, the semiconductor device controller 2 includes the data recovery information comparison unit 28 configured to compare data values of the data recovery information signal DATA_RECOVERY_SIG and the feedback data recovery information signal FB_DATA_RECOVERY_SIG and generate a recovery information comparison signal COMP_DATA_RECOVERY according to a comparison result of the data recovery information signal DATA_RECOVERY_SIG and the feedback data recovery information signal FB_DATA_RECOVERY_SIG, the normal data generation unit 21 configured to generate the normal data NORMAL_DATA by changing the phase of the normal data NORMAL_DATA in correspondence with the recovery information comparison signal COMP_DATA_RECOVERY, the normal data input/output pad 23 configured to input/output the normal data NORMAL_DATA, the data recovery information signal DATA_RECOVERY_SIG and the feedback data recovery information signal FB_DATA_RECOVERY_SIG, the recovery information signal input/output pad 246 configured to input/output the data recovery information signal DATA_RECOVERY_SIG and the feedback data recovery information signal FB_DATA_RECOVERY_SIG and the clock output pad 26 configured to output the source clock SOURCE_CLK.

Likewise, the semiconductor device 1 includes the normal data input/output section 11 configured to input/output the normal data NORMAL_DATA, the data recovery information signal input/output block 100 configured to receive and store the data recovery information signal DATA_RECOVERY_SIG and output the stored data recovery information signal DATA_RECOVERY_SIG as the feedback data recovery information signal FB_DATA_RECOVERY_SIG after a predetermined time period tWCDRL has elapsed, the normal data input/output pad 13 configured to input/output the normal data NORMAL_DATA, the data recovery information signal DATA_RECOVERY_SIG and the feedback data recovery information signal FB_DATA_RECOVERY_SIG, the recovery information signal input/output pad 146 configured to input/output the data recovery information signal DATA_RECOVERY_SIG and the feedback data recovery information signal FB_DATA_RECOVERY_SIG and the clock output pad 16 configured to receive the source clock SOURCE_CLK.

The component elements of the semiconductor system including the semiconductor device in accordance with this embodiment of the present invention are minimum component elements that they are possible to input/output the normal data NORMAL_DATA and the data recovery information signal DATA_RECOVERY_SIG. However, the component elements of the semiconductor system may further include component elements as described below.

Referring again to FIG. 2, the semiconductor system includes the semiconductor device controller 2 configured to transfer the data recovery information signal DATA_RECOVERY_SIG to the semiconductor device 1 in correspondence with a predetermined command OTHER_CMD and transfer the normal data NORMAL_DATA by changing a phase of the normal data NORMAL_DATA in response to the feedback data recovery information signal FB_DATA_RECOVERY_SIG provided from the semiconductor device 1 after a passage of a predetermined time period tWCDRL and the semiconductor device 1 configured to receive the data recovery information signal DATA_RECOVERY_SIG in response to the predetermined command OTHER_CMD and transfer the data recovery information signal DATA_RECOVERY_SIG as the feedback data recovery information signal FB_DATA_RECOVERY_SIG after a passage of a predetermined time period tWCDRL.

At this time, the predetermined command OTHER_CMD transferred from the semiconductor device controller 2 to semiconductor device 1 is synchronized with a center of the source clock SOURCE_CLK, the normal data NORMAL_DATA transferred from the semiconductor device controller 2 to semiconductor device 1 is synchronized with the center of the source clock SOURCE_CLK, the data recovery information signal DATA_RECOVERY_SIG transferred from the semiconductor device controller 2 to semiconductor device 1 is in synchronized with the edge of the source clock SOURCE_CLK.

Furthermore, the predetermined command OTHER_CMD may include an auto refresh operating mode entry command, which is one of operating modes that uses the most power in a semiconductor device, or a standby operating mode entry command, which is one of the operating modes that use the least power in a semiconductor device.

Furthermore, the normal data NORMAL_DATA is transferred from the semiconductor device controller 2 to semiconductor device 1 in response to the data input command WEITE_CMD at the same time of the data recovery information signal DATA_RECOVERY_SIG is transferred from the semiconductor device controller 2 to semiconductor device 1 in response to the data input command WEITE_CMD.

The semiconductor system further includes a clock transmission path configured to transfer the source clock SOURCE_CLK, a command transmission path configured to transfer the predetermined command OTHER_CMD and a normal data transmission path configured to transfer the normal data NORMAL_DATA. The clock transmission path, the command transmission path and the normal data transmission path are formed between the semiconductor device 1 and the semiconductor device controller 2.

The data recovery information signal DATA_RECOVERY_SIG and the feedback data recovery information signal FB_DATA_RECOVERY_SIG are transferred between the semiconductor device controller 2 and the semiconductor device 1 in response to the predetermined command OTHER_CMD. Herein, the data recovery information signal DATA_RECOVERY_SIG and the feedback data recovery information signal FB_DATA_RECOVERY_SIG are transferred through a recovery information signal transmission formed between the semiconductor device 1 and the semiconductor device controller 2 in response to the predetermined command OTHER_CMD. However, the data recovery information signal DATA_RECOVERY_SIG and the feedback data recovery information signal FB_DATA_RECOVERY_SIG are transferred through the normal data transmission path in the operating mode in which the normal data is not transferred through the normal data transmission path.

Accordingly, when the data recovery information signal DATA_RECOVERY_SIG and the feedback data recovery information signal FB_DATA_RECOVERY_SIG are transferred through the recovery information signal transmission path, the semiconductor device controller 2 includes a data recovery information comparison unit 28 configured to compare data values of the data recovery information signal DATA_RECOVERY_SIG and the feedback data recovery information signal FB_DATA_RECOVERY_SIG and generate a recovery information comparison signal COMP_DATA_RECOVERY according to the comparison result of the data recovery information signal DATA_RECOVERY_SIG and the feedback data recovery information signal FB_DATA_RECOVERY_SIG, a normal data generation unit 21 configured to generate the normal data NORMAL_DATA by changing the phase of the normal data NORMAL_DATA in correspondence with the recovery information comparison signal COMP_DATA_RECOVERY in accordance with the predetermined command OTHER_CMD, a normal data input/output pad 23 configured to input/output the normal data NORMAL_DATA, a command output pad 22 configured to output the predetermined command OTHER_CMD and a recovery information signal input/output pad 246 configured to input/output the data recovery information signal DATA_RECOVERY_SIG and the feedback data recovery information signal FB_DATA_RECOVERY_SIG and a clock output pad 26 configured to output the source clock SOURCE_CLK.

Likewise, the semiconductor device 1 includes a normal data input/output section 11 configured to input/output the normal data NORMAL_DATA in response to the data input/output commands READ_CMD/WRITE_CMD, a data recovery information signal input/output block 100 configured to receive and store the data recovery information signal DATA_RECOVERY_SIG and output the stored data recovery information signal DATA_RECOVERY_SIG as the feedback data recovery information signal FB_DATA_RECOVERY_SIG in response to the predetermined command OTHER_CMD after a predetermined time period tWCDRL has elapsed, a normal data input/output pad 13 configured to input/output the normal data NORMAL_DATA, a recovery information signal input/output pad 146 configured to input/output the data recovery information signal DATA_RECOVERY_SIG and the feedback data recovery information signal FB_DATA_RECOVERY_SIG and a clock output pad 16 configured to receive the source clock SOURCE_CLK.

On the other hand, when the data recovery information signal DATA_RECOVERY_SIG and the feedback data recovery information signal FB_DATA_RECOVERY_SIG are transferred through the normal data transmission path in the operating mode in which the normal data NORMAL_DATA is not transferred through the normal data transmission path, the semiconductor device controller 2 includes the data recovery information comparison unit 28 configured to compare data values of the data recovery information signal DATA_RECOVERY_SIG and the feedback data recovery information signal FB_DATA_RECOVERY_SIG and generate a recovery information comparison signal COMP_DATA_RECOVERY according to a comparison result of the data recovery information signal DATA_RECOVERY_SIG and the feedback data recovery information signal FB_DATA_RECOVERY_SIG, the normal data generation unit 21 configured to generate the normal data NORMAL_DATA by changing the phase of the normal data NORMAL_DATA in correspondence with the predetermined command OTHER_CMD, the normal data input/output pad 23 configured to input/output the normal data NORMAL_DATA, the data recovery information signal DATA_RECOVERY_SIG and the feedback data recovery information signal FB_DATA_RECOVERY_SIG and the clock output pad 26 configured to output the source clock SOURCE_CLK.

Likewise, the semiconductor device 1 includes a normal data input/output section 11 configured to input/output the normal data NORMAL_DATA in response to the data input/output commands READ_CMD/WRITE_CMD, a data recovery information signal input/output block 100 configured to receive and store the data recovery information signal DATA_RECOVERY_SIG in response to the predetermined command OTHER_CMD and output the stored data recovery information signal DATA_RECOVERY_SIG as the feedback data recovery information signal FB_DATA_RECOVERY_SIG after a predetermined time period tWCDRL has elapsed, a normal data input/output pad 13 configured to input/output the normal data NORMAL_DATA and a clock output pad 16 configured to receive the source clock SOURCE_CLK.

The above-described component elements of the semiconductor system including the semiconductor device in FIG. 1 of using only one source clock SOURCE_CLK is mainly adopted in a semiconductor device having a low operating speed. In a semiconductor device having a high operating speed. The latest semiconductor system is mainly adopted in which a system clock iHCK for synchronizing command signals including the predetermined command OTHER_CMD and a data clock iWCK, having a frequency two times higher than the system clock iHCK, for synchronizing the normal data NORMAL_DATA, are simultaneously used. The semiconductor device having a high operating speed in accordance with the aforementioned embodiment of the present invention, and therefore, a detailed description thereof has been omitted.

Referring to FIG. 2, a method for operating a semiconductor system having a semiconductor device 1 and a semiconductor device controller 2 in accordance with another embodiment of the present invention includes transferring a data input command WRITE_CMD from the semiconductor device controller 2 to the semiconductor device 1, and transferring a normal data NORMAL_DATA that is synchronized with the center of a source clock SOURCE_CLK and changes in the phase thereof in correspondence to a feedback data recovery information signal FB_DATA_RECOVERY_SIG, after the passage of a first predetermined in time period, transferring a predetermined command OTHER_CMD from the semiconductor device controller 2 to the semiconductor device 1, transferring a data recovery information signal DATA_RECOVERY_SIG that is synchronized with the edge of the source clock SOURCE_CLK, after the passage of the first predetermined time period, and storing the data recovery information signal DATA_RECOVERY_SIG in the semiconductor device 1, and transferring the stored data recovery information signal DATA_RECOVERY_SIG as a feedback data recovery information signal FB_DATA_RECOVERY_SIG from the semiconductor device 1 to the semiconductor device controller 2 when a second predetermined time period has elapsed after the data recovery information signal DATA_RECOVERY_SIG has been stored in the semiconductor device 1.

At this time, the first time needed until the normal data NORMAL_DATA are transferred after a command of the data input/output commands READ_CMD/WRITE_CMD has been transferred, and the first time needed until the data recovery information signal DATA_RECOVERY_SIG after the predetermined command OTHER_CMD has been transferred are determined in synchronism with the source clock SOURCE_CLK.

Similarly, after the data recovery information signal DATA_RECOVERY_SIG has been transferred to and stored in the semiconductor device 1, the second time needed until the stored data recovery information signal DATA_RECOVERY_SIG is transferred to the semiconductor device controller 2 is determined in synchronism with the source clock SOURCE_CLK. While the predetermined command OTHER_CMD may include various operating mode commands of a semiconductor device as well as the data input/output commands READ_CMD/WRITE_CMD, in a particular example, the predetermined command OTHER_CMD may include an auto refresh operating mode entry command, which is one of operating modes that uses the most power in a semiconductor device, or a standby operating mode entry command, which is one of the operating modes that use the least power in a semiconductor device. While the predetermined command OTHER_CMD may include various operating mode commands of a semiconductor device. In the semiconductor system having the semiconductor device 1 and the semiconductor device controller 2 in accordance with another embodiment of the present invention, the transferring of the normal data NORMAL_DATA may include transferring the data input command WRITE_CMD from the semiconductor device controller 2 to a command input pad 12 which is provided in the semiconductor device 1, and transferring the normal data NORMAL_DATA from the semiconductor device controller 2 to a normal data input/output pad 13 which is provided in the semiconductor device 1.

With the normal data input/output pad 13 for transferring the normal data NORMAL_DATA provided as described above, the transferring and storing of the data recovery information signal DATA_RECOVERY_SIG in the semiconductor system having the semiconductor device 1 and the semiconductor device controller 2 in accordance with another embodiment of the present invention may be divided as described below depending upon which command is inputted from the semiconductor device controller 2 to the command input pad 12 provided in the semiconductor device 1 and upon whether or not a dedicated pad 16 for inputting/outputting the data recovery information signal DATA_RECOVERY_SIG is present.

First, as shown in the drawings, in the case where the dedicated pad 16 for inputting/outputting the data recovery information signal DATA_RECOVERY_SIG is present, the transferring and storing of the data recovery information signal DATA_RECOVERY_SIG may include transferring the predetermined command OTHER_CMD from the semiconductor device controller 2 to the command input pad 12 provided in the semiconductor device 1, transferring the data recovery information signal DATA_RECOVERY_SIG from the semiconductor device controller 2 to the data recovery information signal input/output pad 16 provided in the semiconductor device 1, and storing the data recovery information signal DATA_RECOVERY_SIG supplied through the data recovery information signal input/output pad 16 in a register of the semiconductor device 1 which is not directly shown in the drawings but is provided in a recovery information signal input/output block 100. In other words, with the dedicated pad 16 for inputting/outputting the data recovery information signal DATA_RECOVERY_SIG being present as shown in the drawings, the normal data NORMAL_DATA may be inputted/outputted through the normal data input/output pad 13, and the data recovery information signal DATA_RECOVERY_SIG may be inputted/outputted through the data recovery information signal input/output pad 16, irrespective of which command is inputted to the command input pad 12 provided in the semiconductor device 1.

Furthermore, unlike the arrangement shown in the drawings, in the case where the dedicated pad 16 for inputting/outputting the data recovery information signal DATA_RECOVERY_SIG is absent, the transferring and storing of the data recovery information signal DATA_RECOVERY_SIG may include transferring the predetermined command OTHER_CMD from the semiconductor device controller 2 to the command input pad 12 provided in the semiconductor device 1, transferring the data input/output commands READ_CMD/WRITE_CMD from the semiconductor device controller 2 to the data input pad 13 provided in the semiconductor device 1, transferring the data recovery information signal DATA_RECOVERY_SIG from the semiconductor device controller 2 to the normal data input/output pad 13 provided in the semiconductor device 1 when the predetermined command OTHER_CMD is transferred to the command input pad 12 provided in the semiconductor device 1, storing the data recovery information signal DATA_RECOVERY_SIG supplied through the normal data input/output pad 13 in a register provided in the semiconductor device 1 when the predetermined command OTHER_CMD is transferred to the command input pad 12 provided in the semiconductor device 1, and not transferring the data recovery information signal DATA_RECOVERY_SIG from the semiconductor device controller 2 to the semiconductor device 1 when the data input/output commands READ_CMD/WRITE_CMD are transferred to the data input/output pads 13 provided in the semiconductor device 1. That is to say, with the dedicated pad 16 for inputting/outputting the data recovery information signal DATA_RECOVERY_SIG being absent, unlike the arrangement shown in the drawings, the data recovery information signal DATA_RECOVERY_SIG may or may not be transferred depending upon the command supplied to the command input pad 12 provided in the semiconductor device 1.

Both the data recovery information signal DATA_RECOVERY_SIG transferred from the semiconductor device controller 2 to the semiconductor device 1 and the feedback data recovery information signal FB_DATA_RECOVERY_SIG transferred from the semiconductor device 1 to the semiconductor device controller 2 have been described as being signals that have predetermined patterns.

For example, assuming that the data recovery information signal DATA_RECOVERY_SIG and the feedback data recovery information signal FB_DATA_RECOVERY_SIG are 8-bit signals, the pattern of the signals may be '01010101', '00110011', '00001111', '10101010', '11001100', '11110000', '10011001', or '01100110'.

Also, both the data recovery information signal DATA_RECOVERY_SIG transferred from the semiconductor device controller 2 to the semiconductor device 1 and the feedback data recovery information signal FB_DATA_RECOVERY_SIG transferred from the semiconductor device 1 to the semiconductor device controller 2 have been described as signals that are synchronized with the edge of the source clock SOURCE_CLK.

Therefore, in the case where the phase of the data recovery information signal DATA_RECOVERY_SIG changes while being transmitted, as the value of the data recovery information signal DATA_RECOVERY_SIG easily varies, the value of the data recovery information signal DATA_RECOVERY_SIG and the value of the feedback data recovery information signal FB_DATA_RECOVERY_SIG become different from each other.

For example, assuming that the pattern of the data recovery information signal DATA_RECOVERY_SIG is '10011001' when respective bits of the data recovery information signal DATA_RECOVERY_SIG are precisely synchronized with the edges of the source dock SOURCE_CLK, when the phase of the data recovery information signal DATA_RECOVERY_SIG becomes faster in the course of being transmitted from the semiconductor device controller 2 to the semiconductor device 1, the pattern of the feedback data recovery information signal FB_DATA_RECOVERY_SIG transmitted from the semiconductor device 1 to the semiconductor device controller 2 becomes '11001100'. Thus, comparing the values of the data recovery information signal DATA_RECOVERY_SIG and the feedback data recovery information signal FB_DATA_RECOVERY_SIG in the semiconductor device controller 2, the phase becomes faster when the data is transmitted from the semiconductor device controller 2 to the semiconductor device 1.

Conversely, when the phase of the data recovery information signal DATA_RECOVERY_SIG becomes slower in the course of being transmitted from the semiconductor device controller 2 to the semiconductor device 1, the pattern of the feedback data recovery information signal FB_DATA_RECOVERY_SIG transmitted from the semiconductor device 1 to the semiconductor device controller 2 becomes '00110011'. Thus, comparing the values of the data recovery information signal DATA_RECOVERY_SIG and the feedback data recovery information signal FB_DATA_RECOVERY_SIG in the semiconductor device controller 2, the phase becomes slower when the data is transmitted from the semiconductor device controller 2 to the semiconductor device 1.

Moreover, in the semiconductor device controller 2 in accordance with this embodiment of the present invention, the phase of the normal data NORMAL_DATA is changed according to a result of comparing the value of the feedback data recovery information signal FB_DATA_RECOVERY_SIG applied from the semiconductor device 1 and the value of the data recovery information signal DATA_RECOVERY_SIG. For example, if a phenomenon occurs in which the phase becomes faster when data is transmitted from the semiconductor device controller 2 to the semiconductor device 1, a result COMP_DATA_RECOVERY of comparison between the value of the feedback data recovery information signal FB_DATA_RECOVERY_SIG and the value of the data recovery information signal DATA_RECOVERY_SIG becomes a logic 'high', and thus, the phase of the normal data NORMAL_DATA transferred from the semiconductor device controller 2 to the semiconductor device 1 may be changed to be slower than a previous time with respect to the center of the source clock SOURCE_CLK. Conversely, if a phenomenon occurs in which the phase becomes slower when data is transmitted from the semiconductor device controller 2 to the semiconductor device 1, the result COMP_DATA_RECOVERY of comparison between the value of the feedback data recovery information signal FB_DATA_RECOVERY_SIG and the value of the data recovery information signal DATA_RECOVERY_SIG becomes a logic 'low', and thus, the phase of the normal data NORMAL_DATA transferred from the semiconductor device controller 2 to the semiconductor device 1 may be changed to be faster than a previous time with respect to the center of the source clock SOURCE_CLK.

Figure 3:
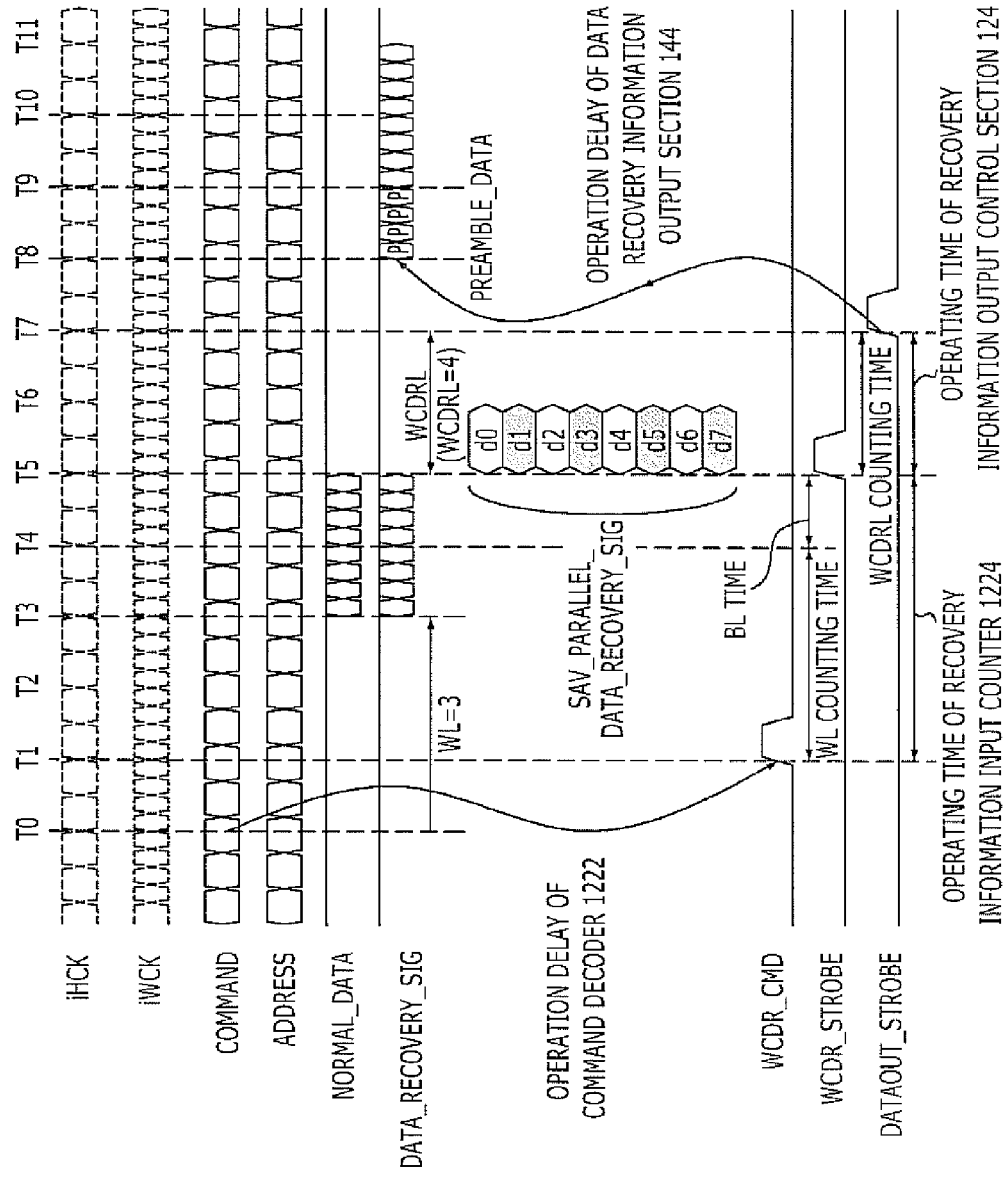
FIG. 3 is a time diagram of the semiconductor device for inputting/outputting a data recovery information signal in a data write operating mode in accordance with the embodiment of the present invention, shown in FIG. 1.

FIG. 3 is a time diagram of the semiconductor device for inputting/outputting a data recovery information signal in a data write operating mode in accordance with the embodiment of the present invention, shown in FIG. 1.

For reference, it is to be noted that the time diagram shown in FIG. 3 is a view depicted on the assumption that a system clock iHCK and a data clock iWCK are simultaneously used in a semiconductor device. That is to say, the time diagram shown in FIG. 3 represents a time diagram that may be obtained when an embodiment of the present invention is applied to a semiconductor device which operates at a high speed.

Referring to FIG. 3, the data input command WRITE_CMD is inputted at time T0 of the system clock iHCK, and, in response to that, the command decoder 1222 of the recovery information input control section 122 provided in the recovery information input/output control unit 120, which is among the component elements of the data recovery information signal input/output block 100, starts to operate. Also, the number of toggling times of the system clock iHCK in correspondence to the value of the write latency signal WL is counted from the time T0 of the system clock iHCK.

Thereafter, the operation of the command decoder 1222 ends at time T1 of the system clock iHCK, and the data recovery operating command WCDR_CMD starts to toggle. At the same time, the recovery information input counter 1224 of the recovery information input control section 122 provided in the recovery input/output control unit 120, which is among the component elements of the data recovery information signal input/output block 100, starts to count the number of toggling times of the system clock iHCK.

Further, since the value of the write latency signal WL is assumed to be '3', the normal data NORMAL_DATA and the data recovery information signal DATA_RECOVERY_SIG are simultaneously inputted at time T3 of the system clock iHCK. However, because the normal data NORMAL_DATA and the data recovery information signal DATA_RECOVERY_SIG are signals each composed of 8 bits, they are not inputted at once at the time T3 of the system clock iHCK, but are serially inputted from the time T3 of the system clock iHCK to time T5 of the system clock iHCK.

At time T4 of the system clock iHCK amid the input of the respective normal data NORMAL_DATA and data recovery information signal DATA_RECOVERY_SIG, the recovery information input counter 1224 counts the number of all toggling times of the system clock iHCK in correspondence with '3' as the value of the write latency signal WL. Nevertheless, since the internal input strobe signal WCDR_STROBE is toggled after counting an additional number of toggling times that is determined in correspondence with the burst lengths of the normal data NORMAL_DATA and the data recovery information signal DATA_RECOVERY_SIG as set in advance in the recovery information input counter 1224, the internal input strobe signal WCDR_STROBE is not toggled at the time T4 of the system clock iHCK. Instead, the internal input strobe signal WCDR_STROBE is toggled at the time T5 of the system clock iHCK as time at which all of the bits of the normal data NORMAL_DATA and the data recovery information signal DATA_RECOVERY_SIG are inputted.

If the time T5 of the system clock iHCK is reached through the above-described procedure, the data recovery information signal DATA_RECOVERY_SIG that has been serially inputted and has been parallelized is stored as is in the parallelized state, in the input storage section 162 of the data recovery information storage unit 160, which is among the component elements of the data recovery information signal input/output block 100, in response to the toggling of the internal input strobe signal WCDR_STROBE. Also, the operation of counting the data clock iWCK in the recovery information output control section 124 is started in response to the toggling of the internal input strobe signal WCDR_STROBE.

For reference, the normal data NORMAL_DATA that is entirely inputted at the time T5 of the system clock iHCK is transferred to a core region 14 and performs a preset operation.

In the drawings, since the value of the recovery information signal WCDRL is '4', the recovery information output control section 124 counts four toggling times of the data clock iWCK from the time T5 of the system clock iHCK as time at which the internal input strobe signal WCDR_STROBE toggles, and thereafter, toggles the internal output strobe signal DATAOUT_STROBE at time T7 of the system clock iHCK.

In this way, while the internal output strobe signal DATAOUT_STROBE starts to toggle at the time of T7 of the system clock iHCK, since a time to operate required for the recovery information output section 144 provided in the data recovery information input/output unit 140, which is among the component elements of the data recovery information signal input/output block 100, that is, the time at which the preamble data PREAMBLE DATA is actually outputted, is time T8 of the system clock iHCK.

Following the time T8 of the system clock iHCK at which the preamble data PREAMBLE DATA starts to be outputted, the data recovery information signal DATA_RECOVERY_SIG is consecutively outputted from time T9 of the system clock iHCK to time T11 of the system clock iHCK.

As aforementioned above, the semiconductor device in accordance with this embodiment of the present invention receives the data recovery information signal DATA_RECOVERY_SIG from the semiconductor device controller at the same time as the normal data NORMAL_DATA that corresponds to the time T3 of the system clock iHCK, stores the data recovery information signal DATA_RECOVERY_SIG at the time T5 of the system clock iHCK, and then transmits the data recovery information signal DATA_RECOVERY_SIG back to the semiconductor device controller at predetermined time that corresponds to the time T8 of the system clock iHCK.

Through these operations, the semiconductor device controller can be fed back with and can analyze the value of the data recovery information signal DATA_RECOVERY_SIG that is transmitted under the same circumstances in which the normal data NORMAL_DATA is transmitted from the semiconductor device controller to the semiconductor device, and the result of the analysis can be reflected on the phase of the normal data NORMAL_DATA to be subsequently transmitted from the semiconductor device controller to the semiconductor device, whereby the stability of the normal data NORMAL_DATA can be always ensured.

Figure 4:
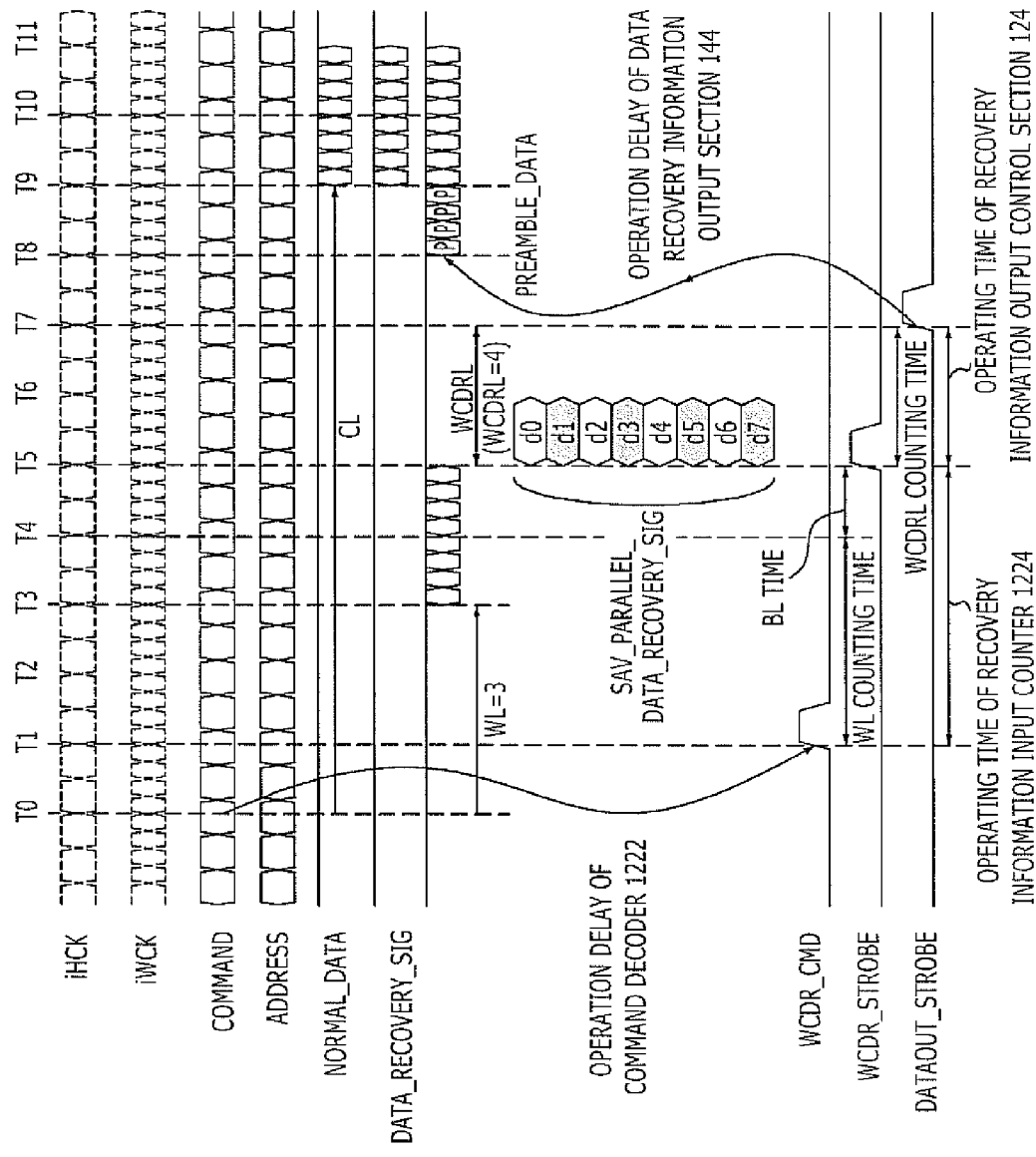
FIG. 4 is a time diagram of the semiconductor device for inputting/outputting a data recovery information signal in one of a data read operating mode and a predetermined internal operating mode in accordance with the embodiment of the present invention, shown in FIG. 1.

FIG. 4 is a time diagram of the semiconductor device for inputting/outputting a data recovery information signal in either a data read operating mode or a predetermined internal operating mode in accordance with the embodiment of the present invention, shown in FIG. 1.

For reference, it is to be noted that the time diagram shown in FIG. 4 is a view depicted on the assumption that a system clock iHCK and a data clock iWCK are simultaneously used in a semiconductor device. That is to say, the time diagram shown in FIG. 4 represents a time diagram that may be obtained when an embodiment of the present invention is applied to a semiconductor device which operates at a high speed.

Referring to FIG. 4, the data output command READ_CMD is inputted at time T0 of the system clock iHCK, and, in response thereto, the command decoder 1222 of the recovery information input control section 122 provided in the recovery information input/output control unit 120, which is among the component elements of the data recovery information signal input/output block 100, starts to operate. Also, the number of toggling times of the system clock iHCK in correspondence with the value of the column latency signal CL is counted from the time T0 of the system clock iHCK.

Thereafter, the operation of the command decoder 1222 ends at time T1 of the system clock iHCK, and the data recovery operating command WCDR_CMD starts to toggle. At the same time, the recovery information input counter 1224 of the recovery information input control section 122 provided in the recovery input/output control unit 120, which is among the component elements of the data recovery information signal input/output block 100, starts to count the number of toggling times of the system clock iHCK.

Further, since the value of the write latency signal WL is assumed to be '3', the data recovery information signal DATA_RECOVERY_SIG is inputted at time T3 of the system clock iHCK. However, because the data recovery information signal DATA_RECOVERY_SIG is a signal composed of 8 bits, it is not inputted at once at the time T3 of the system clock iHCK, but is serially inputted from the time T3 of the system clock iHCK to time T5 of the system clock iHCK.

For reference, because the value of the column latency signal CL is assumed to be '9', an operation for receiving or outputting the normal data NORMAL_DATA is not performed until time T9 of the system clock iHCK, irrespective of the fact that the data recovery information signal DATA_RECOVERY_SIG is inputted at the time T3 of the system clock iHCK in correspondence with the value of the write latency signal WL.

At time T4 of the system clock iHCK amid the input of the data recovery information signal DATA_RECOVERY_SIG, the recovery information input counter 1224 counts the number of all toggling times of the system clock iHCK in correspondence with '3' as the value of the write latency signal WL. Nevertheless, since the internal input strobe signal WCDR_STROBE is toggled after counting an additional number of toggling times that is determined in correspondence with the burst length of the data recovery information signal DATA_RECOVERY_SIG as set in advance in the recovery information input counter 1224, the internal input strobe signal WCDR_STROBE is not toggled at the time T4 of the system clock iHCK. Instead, the internal input strobe signal WCDR_STROBE is toggled at the time T5 of the system clock iHCK as time at which all of the bits of the normal data NORMAL_DATA and the data recovery information signal DATA_RECOVERY_SIG are inputted.

If the time T5 of the system clock iHCK is reached through the above-described procedure, the data recovery information signal DATA_RECOVERY_SIG, that has been serially inputted and has been parallelized, is stored as is in the parallelized state, in the input storage section 162 of the data recovery information storage unit 160, which is among the component elements of the data recovery information signal input/output block 100, in response to the toggling of the internal input strobe signal WCDR_STROBE. Also, the operation of counting the data clock iWCK in the recovery information output control section 124 is started in response to the toggling of the internal input strobe signal WCDR_STROBE.

In the drawings, since the value of the recovery information signal WCDRL is '4', the recovery information output control section 124 counts four toggling times of the data clock iWCK from the time T5 of the system clock iHCK as time at which the internal input strobe signal WCDR_STROBE toggles, and thereafter, toggles the internal output strobe signal DATAOUT_STROBE at time T7 of the system clock iHCK.

In this way, while the internal output strobe signal DATAOUT_STROBE starts to toggle at the time of T7 of the system clock iHCK, since a time to operate required for the recovery information output section 144 provided in the data recovery information input/output unit 140, which is among the component elements of the data recovery information signal input/output block 100, that is, the time at which the preamble data PREAMBLE DATA is actually outputted, is time T8 of the system clock iHCK.

Following the time T8 of the system clock iHCK at which the preamble data PREAMBLE DATA starts to be outputted, the data recovery information signal DATA_RECOVERY_SIG is consecutively outputted from time T9 of the system clock iHCK to time T11 of the system clock iHCK.

For reference, since the value of the column latency signal CL is 9 and the normal data NORMAL_DATA is outputted from T9 to T11 of the system clock iHCK, it was illustrated in the drawings that the output time of the data recovery information signal DATA_RECOVERY_SIG and the output time of the normal data NORMAL_DATA correspond to each other. However, this is merely an operation resulting from an accidental match of various values. That is to say, in the present invention, the determination of the output time of the normal data NORMAL_DATA in correspondence with the data output command READ_CMD and the determination of the output time of the data recovery information signal DATA_RECOVERY_SIG have no relationship to each other.

Illustrated in the drawings is the operation for receiving/outputting the data recovery information signal DATA_RECOVERY_SIG in correspondence with the data output command READ_CMD when the data output command READ_CMD is applied.

However, when the predetermined command OTHER_CMD is supplied instead of the data output command READ_CMD, the operation for receiving/outputting the data recovery information signal DATA_RECOVERY_SIG in correspondence thereto also corresponds entirely to that shown in the drawings. In other words, in the drawings, the operation of receiving/outputting the data recovery information signal DATA_RECOVERY_SIG excluding the output of the normal data NORMAL_DATA in correspondence with the data output command READ_CMD corresponds entirely in both cases.

As aforementioned above, the semiconductor device in accordance with this embodiment of the present invention receives the data recovery information signal DATA_RECOVERY_SIG from the semiconductor device controller at the time, corresponding to the time T3 of the system clock iHCK, at which the normal data NORMAL_DATA is inputted in correspondence with the data input command WRITE_CMD irrespective of the kind of a command signal supplied to the semiconductor device, stores the inputted data recovery information signal DATA_RECOVERY_SIG at the time T5 of the system click iHCK, and then transmits the data recovery information signal DATA_RECOVERY_SIG back to the semiconductor device controller at a predetermined time that corresponds to the time T8 of the system clock iHCK.

Through these operations, even when the normal data NORMAL_DATA has not been transmitted from the semiconductor device controller to the semiconductor device, the data recovery information signal DATA_RECOVERY_SIG may be transmitted in advance and the semiconductor device controller may be fed back with and may analyze the value of the data recovery information signal DATA_RECOVERY_SIG, and the result of the analysis can be reflected in the phase of the normal data NORMAL_DATA to be subsequently transmitted from the semiconductor device controller to the semiconductor device, whereby the stability of the normal data NORMAL_DATA can be always ensured.

As is apparent from the above description, in an embodiment of the present invention, when data is inputted/outputted between a semiconductor device controller and a semiconductor device, if the phase of data changes due to the occurrence of a phenomenon in which an operating temperature or operating power of a semiconductor system varies, the change is detected and compensated for using pattern signals inputted/outputted between the semiconductor device controller and the semiconductor device at the same time with the data, whereby the data may always be stably inputted/outputted between the semiconductor device controller and the semiconductor device.

While the present invention has been described with respect to the specific embodiments, it will be apparent to those skilled in the art that various changes and modifications may be made without departing from the spirit and scope of the present invention as defined by the following claims.

For example, the predetermined command OTHER_CMD described above may include any command as long as it controls the operation of a semiconductor device, in addition to the aforementioned auto refresh operating mode entry command or standby operating mode entry command.

What is claimed is:

1. A semiconductor system including a semiconductor device and a semiconductor device controller, for transferring and receiving a normal data each other, comprising:
the semiconductor device controller configured to compare a data recovery information signal and a feedback data recovery information signal and adjust a phase of the normal data transferred to the semiconductor device in correspondence with a comparison result of the data recovery information signal and the feedback data recovery information signal; and
the semiconductor device configured to receive the data recovery information signal and transfer the data recovery information signal as the feedback data recovery information signal after a passage of a predetermined time period,
wherein the normal data transferred from the semiconductor system to the semiconductor device is synchronized with a center of a source clock, and the data recovery information signal is synchronized with an edge of the source clock.

2. The semiconductor system of claim 1, wherein the semiconductor device controller includes:
a data recovery information comparison unit configured to compare values of the data recovery information signal with the feedback data recovery information signal and generate a recovery information comparison signal in correspondence with the comparison result; and
a normal data generation unit configured to generate the normal data by changing the phase of the normal data in correspondence with the recovery information comparison signal.

3. The semiconductor system of claim 2, wherein the semiconductor device includes:
a normal data input/output section configured to input/output the normal data; and
a data recovery information signal input/output block configured to receive and store the data recovery information signal and output the data recovery information signal as the feedback data recovery information signal after a predetermined time period has elapsed.

4. The semiconductor system of claim 3, further comprising:
a clock transmission path configured to transfer the source clock disposed between the semiconductor device and the semiconductor device controller.

5. The semiconductor system of claim 4, further comprising:
a normal data transmission path configured to transfer the normal data disposed between the semiconductor device and the semiconductor device controller.

6. The semiconductor system of claim 5, further comprising:
a recovery information signal transmission path configured to transfer the recovery information signal and feedback data recovery information signal between the semiconductor device and the semiconductor device controller.

7. The semiconductor system of claim 5, wherein the data recovery information signal and the feedback data recovery information signal are transferred through the normal data transmission path in an operating mode in which the normal data is not transferred through the normal data transmission path.

8. The semiconductor system of claim 1, wherein the normal data and the data recovery information signal are transferred from the semiconductor device controller to semiconductor device at the same time.

9. A semiconductor system including a semiconductor device and a semiconductor device controller for transferring and receiving a normal data each other, comprising:
the semiconductor device controller configured to transfer a data recovery information signal to the semiconductor device in correspondence with a predetermined command and adjust a phase of the normal data in response to a feedback data recovery information signal provided from the semiconductor device after a passage of a predetermined time period; and
the semiconductor device configured to receive the data recovery information signal in response to the predetermined command and transfer the data recovery information signal as the feedback data recovery information signal after a passage of a predetermined time period, wherein the predetermined command transferred from the semiconductor device controller to semiconductor device is synchronized with a center of a source clock, the normal data is in synchronized with a center of a source clock, the data recovery information signal is in synchronized with an edge of a source clock.

10. The semiconductor system of claim 9, wherein the predetermined command includes data input/output commands.

11. The semiconductor system of claim 10, wherein the semiconductor device controller, includes:
   a command generation section configured to generate the predetermined command;
   a data recovery information comparison unit configured to compare values of the data recovery information signal and the feedback data recovery information signal and generate a recovery information comparison signal the result of comparing the data recovery inform in correspondence with data recovery information signal and the feedback data recovery information signal; and
   a normal data generation unit configured to generate the normal data in correspondence with the data input command by changing the phase the normal data in correspondence with the recovery information comparison signal.

12. The semiconductor system of claim 11, wherein the semiconductor device, includes:
   a normal data input/output section configured to input/output the normal data in response to the data input/output commands; and
   a data recovery information signal input/output block configured to receive and store the data recovery information signal in response to the predetermined command and output the data recovery information signal as the feedback data recovery information signal after a predetermined time period has elapsed.

13. The semiconductor system of claim 12, wherein the data recovery information signal and the feedback data recovery information signal are transferred through a normal data transmission path in correspondence with commands of all but the data input/output commands among the predetermined command.

14. The semiconductor system of claim 9, wherein the normal data is transferred in correspondence with the data input command from the semiconductor device controller to semiconductor device at the same time of that the data recovery information signal is transferred in correspondence with the predetermined command from the semiconductor device controller to semiconductor device.

15. The semiconductor system of claim 9, wherein the source clock includes:
   a system clock for synchronizing the predetermined commands; and
   a data clock for synchronizing the data recovery information signal and the normal data.

* * * * *